United States Patent

Fujii

(10) Patent No.: US 6,727,045 B2
(45) Date of Patent: Apr. 27, 2004

(54) METHOD AND APPARATUS FOR DEVELOPING PHOTOSENSITIVE RESIN RELIEF PRINTING PLATE

(75) Inventor: Hirotatsu Fujii, Fuji (JP)

(73) Assignee: Asahi Kasei Kabushiki Kaisha, Osaka (JP)

(*) Notice: Subject to any disclaimer, the term of this patent is extended or adjusted under 35 U.S.C. 154(b) by 0 days.

(21) Appl. No.: 10/148,989

(22) PCT Filed: Oct. 9, 2001

(86) PCT No.: PCT/JP01/08856
§ 371 (c)(1),
(2), (4) Date: Jun. 6, 2002

(87) PCT Pub. No.: WO02/33490
PCT Pub. Date: Apr. 25, 2002

(65) Prior Publication Data
US 2002/0182543 A1 Dec. 5, 2002

(30) Foreign Application Priority Data
Oct. 13, 2000 (JP) .................. 2000-314201

(51) Int. Cl.[7] .................. G03F 7/30
(52) U.S. Cl. .................. 430/302
(58) Field of Search .................. 430/302

(56) References Cited

U.S. PATENT DOCUMENTS

| | | | |
|---|---|---|---|
| 4,042,386 A | * 8/1977 | Okai et al. | 430/281.1 |
| 4,202,696 A | 5/1980 | Takahashi et al. | 430/306 |
| 4,233,391 A | * 11/1980 | Okai et al. | 430/181 |
| 4,540,649 A | * 9/1985 | Sakurai | 430/270.1 |

FOREIGN PATENT DOCUMENTS

| | | |
|---|---|---|
| JP | 4-285962 A | 10/1992 |
| JP | 7-333860 A | 12/1995 |
| JP | 9-288356 A | 11/1997 |
| JP | 2000-29227 A | 1/2000 |
| JP | 2000-221693 A | 8/2000 |
| WO | WO 89/11924 | 12/1989 |

* cited by examiner

Primary Examiner—Hoa Van Le
(74) Attorney, Agent, or Firm—Birch, Stewart, Kolasch & Birch, LLP (57) ABSTRACT

A developing method for a photosensitive resin printing plate which can reduce the cost for treating waste liquid by using an aqueous developing liquid not containing surfactant and recycling and reusing the developing liquid. A photosensitive resin printing plate which is hardened in a prescribed pattern by exposure is developed by spraying an aqueous developing liquid comprising either water only or two phases of gas and liquid to a surface of printing plate under a high pressure (water pressure 1 to 30 MPa, gas pressure not lower than 0.1 MPa), a hygroscopic photosensitive resin mixed in a worn-out developing liquid is separated and removed by means of filter or the like, and filtrate is recycled and reused as a developing liquid.

12 Claims, 5 Drawing Sheets

METHOD AND APPARATUS FOR DEVELOPING PHOTOSENSITIVE RESIN RELIEF PRINTING PLATE

This application is the national phase under 35 U.S.C. § 371 of PCT International Application No. PCT/JP01/08856 which has an International filing date of Oct. 9, 2001, which designated the United States of America.

TECHNICAL FIELD

The present invention relates to a method for producing a photosensitive letterpress printing plate used in a letterpress printing such as corrugated board printing, film printing, preprint printing and label printing. In particular, the present invention relates to a method for producing a photosensitive letterpress printing plate which uses aqueous developing liquid, thereby minimizing the waste liquid discharged in a development treatment for a photosensitive letterpress printing plate.

BACKGROUND ART

A photosensitive letterpress printing plate has been used as a printing plate for letterpress printing represented by corrugated board printing, film printing, preprint printing and label printing.

APR (trade name, made by Asahi Kasei Corp.), one of the photosensitive resins, is a most typical product as a liquid photosensitive resin, and several models of equipment such as ALF, AWF and ASF (all trade names, made by Asahi Kasei) are commercially available as a plate-making equipment using this photosensitive resin. A plate-making is performed by the following process using the photosensitive resin. Firstly, a photosensitive resin is coated on a transparent carrier film in a uniform thickness, then laminated with a base film. The laminate structure is irradiated by UV light through a transparent image bearer such as a negative film made by another system in advance, through which UV light is selectively transmitted, so that a photosensitive resin in the exposed area photochemically hardens locally to form a relief image, then unhardened resin is removed and recovered using a rubber blade and the like, and finally unhardened resin remaining on a relief surface is washed out completely with wash out solution (developing solution), followed by application of a necessary post-treatment to produce a photosensitive letterpress printing plate to be provided for printing.

In a developing process in which unhardened resin is washed off, presently, unhardened resin is washed off and removed by means of a developing solution having a high chemical activity. However, if the developing solution contains unhardened resin more than a certain amount, the solution loses a developing ability and becomes impossible to be used. The unusable developing solution has to be consigned to an industrial waste disposal trader because the waste solution can not be discharged into sewage or the natural environment. The waste solution is high in volume and disposal cost, and has become an economical problem.

In addition, presently a post-exposure process is carried out after the developing process. This post-exposure process enhances mechanical properties by hardening unreacted resin in and on the surface of the hardened plate obtained in the developing process, and also reduces tackiness on the surface of the hardened plate by irradiating an active light to the printing plate. In this post-exposure process, in order to facilitate a polymerization reaction on the surface of the photosensitive resin layer, a photosensitive resin plate is exposed to active light in a liquid so that the plate is shielded from oxygen in the air. However, practice of the post-exposure process in a liquid results in dirty plate-making equipment and its surroundings and lowering of operation efficiency. Thus, a problem of significant deterioration of the working environment arises.

Based on the above-described situation, development of a method for reducing the cost for treating worn-out developing solution and a method for applying a post-exposure in air to improve the working environment have been strongly demanded.

On the other hand, with regard to a developing process, an example of a developing method, in which a highly pressurized aqueous developing solution is sprayed from spray nozzles to a photosensitive resin layer of an object to be developed, has been disclosed in JP-A-2000-29227 (Kansai New Technology Laboratory Co., Ltd., "A Pattern Forming Method and Photosensitive Resin Compound"). The developing solution used in this developing method is an aqueous developing liquid, substantially water. In a conventional developing method, an unhardened resin is decomposed and removed using the chemical action of a surfactant contained in a developing solution, whereas in this developing method of JP-A-2000-29227, in which unhardened resin is washed off using a developing liquid substantially not containing a chemical component such as surfactant, unhardened resin is scattered and removed by giving large physical energy to a relief surface by means of spraying a developing liquid at high pressure. Accordingly, water can sufficiently work as a developing liquid because the developing liquid does not require chemical activity. Thus the cost for a wash out agent such as surfactant has been reduced, and the life of developing liquid has been extended compared with a developing method using a surfactant because the life of the developing liquid hardly depends on an amount of unhardened resin mixed in the developing liquid, and therefore, the cost to treat waste developing liquid has been reduced. However, although this method could solve the problem to reduce the cost to treat waste developing liquid, it still had a problem that this method could not provide a printing plate having a reproduction on the plate having sharp printing results, as well as that this method required several times the wash out time compared with the conventional method to provide a printing plate having a reproduction on the plate having sharp printing results.

Based on the above described situation, development of a method for developing a photosensitive resin letterpress printing plate is strongly demanded, which makes it possible to reduce the cost to treat worn-out developing liquid, and to give sharp printing results with a comparative developing time to that of the conventional developing method using surfactant.

DISCLOSURE OF THE INVENTION

The invention is directed to respond to these demands, and provides a plate-making method in which the volume of waste developing liquid discharged is reduced by recycling and reusing the developing liquid for a photosensitive resin letterpress printing plate after an exposure process to reduce the cost for treating waste liquid, and at the same time, even a post-exposure process in air can be realized.

The inventors enthusiastically studied to solve the above problems, and found the fact that a photosensitive resin letterpress printing plate with no tackiness on a plate surface can be obtained by removing unhardened resin from the printing plate with physical force using a developing liquid mainly comprising water not containing a special wash out component at a high temperature, then applying a post-exposure in air by adding a small amount of photosensitive hydrogen abstracting agent in the developing agent if necessary, and completed this invention.

Thus, the present invention provides:

(1) A method for developing photosensitive resin letterpress printing plate comprising spraying an aqueous developing liquid at a temperature not lower than 40° C. under high pressure to a photosensitive resin letterpress printing plate after exposure.

(2) A method according to the above (1), wherein the aqueous developing liquid is sprayed under a pressure of not lower than 1 MPa and not higher than 30 MPa.

(3) A method according to the above (1) or (2), wherein a gas is mixed in the aqueous developing liquid.

(4) A method according to any one of the above (1) to (3), wherein the aqueous developing liquid is recycled and reused after removing a mixed-in photosensitive resin from the aqueous developing liquid by means of a filter.

(5) A method according to the above (4), wherein a surface of the photosensitive resin letterpress printing plate is sprayed with the aqueous developing liquid, then rinsed with water, and the water is then mixed into the aqueous developing liquid.

(6) A method according to any one of the above (1) to (5), wherein an aqueous developing liquid contains a photosensitive hydrogen abstracting agent.

(7) A method according to the above (6), wherein a surface of the letterpress printing plate is sprayed with the aqueous developing liquid, then irradiated with an active light in air.

(8) A method according to the above (7), wherein the active light is mainly an UV light having a wavelength in a range of 200 to 400 nm.

(9) A method according to any one of the above (1) to (8), wherein at least one nozzle is used to spray the aqueous developing liquid under a pressure of not lower than 1 MPa and not higher than 30 MPa.

(10) A method according to any one of the above (1) to (9), wherein a pump capable of delivering the aqueous developing liquid under a pressure of not lower than 1 MPa and not higher than 30 MPa is used.

(11) A method according to any one of the above (1) to (10), wherein an oil-absorbing mat filter, non-woven fabric filter or paper filter is provided on a surface of the aqueous developing liquid reserved in a tank and/or in a pipe through which the aqueous developing liquid flows, and the aqueous developing liquid is filtered with any of these kinds of filters.

(12) A developing equipment for a photosensitive resin letterpress printing plate used for a method according to any one of the above (1) to (11).

(13) A developing equipment for a photosensitive resin letterpress printing plate comprising:
 (a) a plate treatment section comprising a support to fix a photosensitive resin letterpress printing plate and a nozzle header being installed so as to oppose to the support and being arranged with at least one spray nozzle to spray a highly pressurized aqueous developing liquid;
 (b) a liquid tank section to reserve the aqueous developing liquid equipped with a heater; and
 (c) a high pressure jet pump connected to the liquid tank section in the input side and connected to said nozzle header in the output side.

(14) A developing equipment according to the above (13), wherein the spray nozzle and the high pressure jet pump can spray and deliver the aqueous developing liquid under a pressure of not lower than 1 MPa and not higher than 30 MPa, respectively.

(15) A developing equipment according to the above (13), wherein a filter is installed in said liquid tank section.

(16) A developing equipment according to the above (13), wherein a nozzle header to spray rinsing water is equipped in the plate treatment section, and the liquid tank section is capable of reserving together both rinsing water after spraying and aqueous developing liquid after spraying.

(17) A developing equipment according to the above (13), wherein the plate treatment section further comprises a lamp section arranged with at least one lamp to emit an active light in air.

BEST MODE FOR CARRYING OUT THE INVENTION

The developing method for a printing plate of the present invention comprises a series of processes including a spraying process of an aqueous developing liquid to a printing plate at a high pressure under specified conditions, then a rinsing process using mainly water and a post-exposure process by irradiation of an active light. Firstly, an outline of the developing method and the developing equipment of the present invention will be described with reference to FIG. 1.

Figure 1:
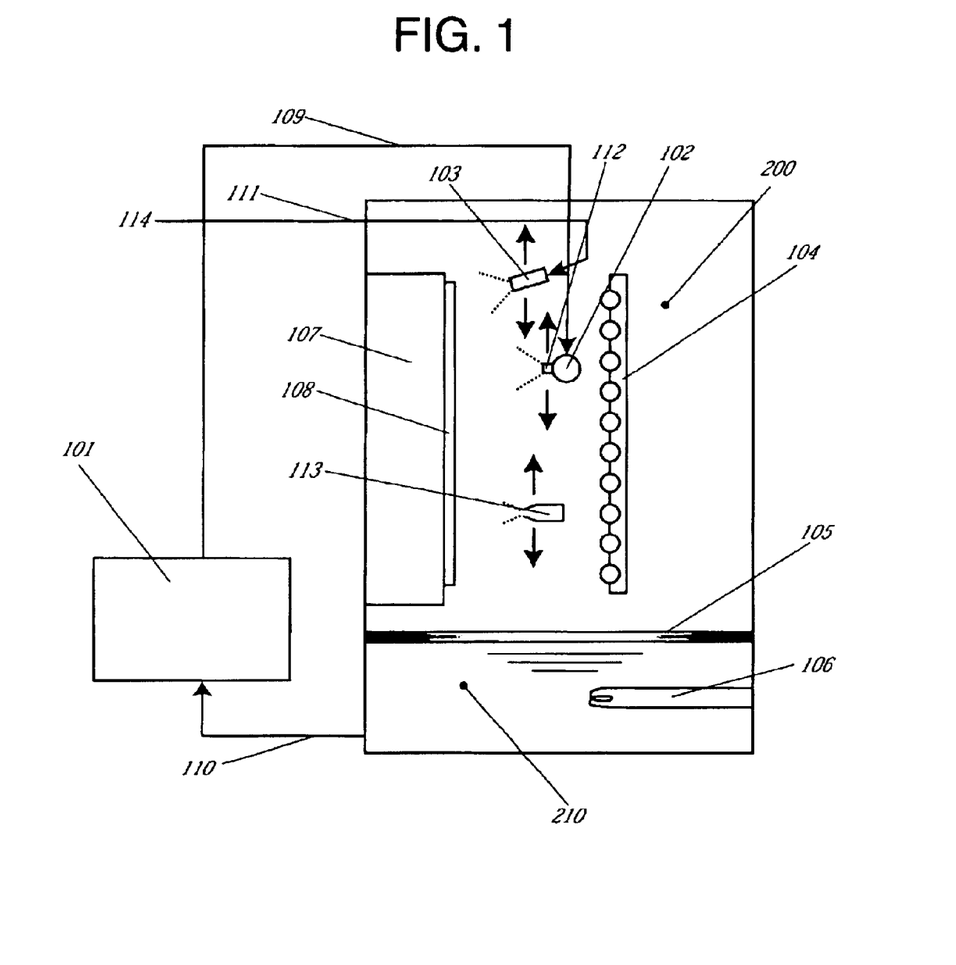
FIG. 1 is a drawing illustrating a schematic composition of a developing equipment suitable for implementation of the present invention.

FIG. 1 is a schematic drawing of an example of developing equipment utilizing the developing method of the present invention. As shown in the drawing, the developing equipment of the present invention is composed of a plate treatment section 200 to perform a high pressure spray development, a subsequent rinsing treatment and a post-exposure treatment, a liquid tank section 210 to heat up the liquid, and a high pressure jet pump 101 providing a highly pressurized developing liquid.

In the plate treatment section 200, a support 107 is equipped to fix a photosensitive resin letterpress printing plate 108 to be developed with a clip or the like, and a nozzle header 102 arranged with one or more spray nozzles 112 to spray highly pressurized developing liquid to the fixed photosensitive resin letterpress printing plate in a perpendicular direction to a surface of the photosensitive resin letterpress printing plate. To an input side of this nozzle header 102, a high pressure jet pump 101 is connected through a hose 109 for exclusive use for a high pressure superior in heat and pressure resistances. In the plate treatment section 200, a nozzle header 103 is further equipped in order to spray rinsing water to wash off the developing liquid remaining on a surface of a photosensitive resin letterpress printing plate after a high pressure developing treatment. To an input side of the nozzle header for spraying rinsing water, a water service pipe 114 is connected through a hose 111. A gas blow nozzle 113 may further be equipped to blow off rinsing water remaining on a surface of a photosensitive resin letterpress printing plate. Further, a lamp section 104 is arranged with one or more lamps to irradiate an active light in air in parallel to a surface of a photosensitive resin letterpress printing plate for the purpose of removing tackiness of a surface of a photosensitive resin letterpress printing plate and enhancing the physical properties of the letterpress printing plate itself.

In a liquid tank section 210, a heater 106 is equipped to heat up developing liquid to a prescribed temperature or to maintain it at a prescribed temperature. In addition, on a surface of developing liquid reserved in the liquid tank, a filter 105 such as an oil-absorbing mat, non-woven filter and paper filter is provided to filter a liquid resin mixed in the developing liquid if necessary.

A high pressure jet pump 101 constitutes a pressure source of this developing equipment. An input side of the high pressure jet pump 101 is connected to liquid tank 210 through a hose 110. On the other hand, an output side of the high pressure jet pump 101 is connected to a nozzle header 102 arranged with one or more nozzles 112 to spray a highly pressurized developing liquid through a hose 109 for exclusive use for high pressure.

In the developing equipment for a photosensitive resin letterpress printing plate having the above composition, by driving the high pressure jet pump, a developing liquid heated up to a prescribed temperature in the liquid tank 210 is sucked into the high pressure jet pump 101 and then supplied to the nozzle header 102 in a highly pressurized state. The developing liquid supplied to the nozzle header 102 is sprayed out from a spraying hole in atomized or homogenized state. The developing liquid sprayed out from the spray nozzle 112 is, after splashing against a photosensitive resin letterpress printing plate and removal of unhardened resin via a filter 105, taken in a liquid tank 210. The liquid is again sucked into a high pressure jet pump 101 through a hose 110 connected to the liquid tank 210. After development is thoroughly performed, rinsing water sucked directly from a water service is sprayed from a nozzle header 103 for spraying rinsing water to wash off developing liquid remaining on a surface of a photosensitive resin letterpress printing plate. This rinsing water is directly taken into a liquid tank 210 as it is. After the rinsing treatment is finished, the rinsing water is blown off by blowing a gas from a gas blow nozzle 113 to a photosensitive resin letterpress printing plate if necessary, then post-exposure is carried out by irradiating an active light to a photosensitive resin letterpress printing plate with an active light lamp 104.

As described above, a high pressure spray developing method and equipment of the present invention using the developing method and equipment for a photosensitive resin letterpress printing plate based on the composition illustrated in FIG. 1 can be applied to a liquid or solid photosensitive resin printing plate provided to an exposure process by a usual procedure. That is, an exposure is given to a printing plate composition obtained by laminating a cover film, a photosensitive resin, a base film and a masking film on a negative film bearing a prescribed design of images. After the exposure, the cover film is peeled off, then a certain extent of unhardened resin is recovered from a main body of the photosensitive resin letterpress printing plate with a rubber spatula, air knife or the like if necessary, then the photosensitive resin letterpress printing plate is inserted and fixed in a plate treatment section of the above-described developing equipment for a photosensitive resin letterpress printing plate, and can be applied to the above-described high pressure spray development.

Hereinbelow, an embodiment to carry out the present invention will be described more specifically.

An aqueous developing liquid is used in the present invention. Aqueous developing liquid used here means a developing liquid which has a sufficiently low solubility or emulsifying action for the unhardened photosensitive resin to be removed and easily enables regeneration of the developing liquid by treating a waste developing liquid by a comparatively simple method such as filtration, and includes, for example, a liquid mainly comprising water containing not higher than 0.5% by weight of surfactant, though it depends on the kind of photosensitive resin of printing plate to be developed. This aqueous developing liquid may contain other components than water such as a small amount of surfactant, alcohol, organic solvent and surface treatment agent within limits not to impair the effect of the present invention, if necessary.

Conventionally, as an aqueous developing liquid generally used for a developing liquid for a liquid photosensitive resin, an aqueous solution containing 1 to 5% of surfactant has been used, which performs developing by dissolving a resin by means of a chemical action. However, if this developing liquid is used, since unhardened resin removed in the developing process is dispersed in the developing liquid, it becomes difficult to remove only the resin component from the developing liquid. Such developing liquid containing unhardened photosensitive resin not only decreases in resin dispersibility but also gives unfavorable effect on tack removal of a surface of a printing plate by a post-exposure process as described below. Contrary, since the aqueous developing liquid of the present invention is an aqueous developing liquid containing little surfactant, and a hygroscopic resin component can not disperse in an aqueous developing liquid of the present invention, it becomes easy to remove only unhardened resin component from a worn-out aqueous developing liquid after the developing process.

Thus, in the present invention, use of an aqueous developing liquid can make it easy to separate unhardened resin contained in an aqueous developing liquid after development from the developing liquid, and enables recycle and reuse of the developing liquid to achieve a prolonged life of the developing liquid. However, the aqueous developing liquid of the present invention may contain suitable amounts of photosensitive hydrogen abstracting agent for a post-exposure process as described below and other various additives including surfactant if necessary within limits not to impair the elongated life of the developing liquid.

With regard to an amount of resin mixed in the aqueous developing liquid, a sufficient developing effect can be maintained if an amount of mixed-in resin is not higher than 4.0 parts by weight per 100 parts by weight of developing liquid.

In the present invention, the above-described life of developing liquid can be further extended by providing filters at suitable locations of the equipment to separate and remove a resin component in an aqueous developing liquid. For example, a filter (FIG. 1, 105) such as an oil-absorbing mat, non-woven fabric filter and paper filter are placed on a surface of the liquid tank (FIG. 1, 210), reserving worn-out developing liquid after spraying the developing liquid on a photosensitive resin letterpress printing plate. Thus, the aqueous developing liquid can be recycled by removing the majority of unhardened resin in the developing liquid with the filter, through which the developing liquid passes and returns to the liquid tank.

In an aqueous developing liquid of the present invention, a gas may be mixed in order to enhance developing force when said developing liquid is sprayed. When a gas is mixed in an aqueous developing liquid, the pressure of gas is preferably not lower than 0.1 MPa. Under the pressure lower than 0.1 MPa, an improvement of developing effect by a physical impact due to mixing of a gas can not be observed.

An aqueous developing liquid of the present invention may contain an appropriate amount of a photosensitive hydrogen abstracting agent for a post-exposure process for the purpose of removing tackiness remaining on a plate surface after the developing process. A photosensitive hydrogen abstracting agent used in the present invention is desirably an organic carbonyl compound capable of pulling out a hydrogen atom of other compounds in an activated state by irradiating active light, for example, like a photosensitive hydrogen abstracting agent described in JP-A-9-288356. In this case, a suitable hydrogen abstracting agent is an organic carbonyl compound showing the same or higher level of hydrogen abstracting reactivity compared with other reactions based on a carbonyl group in a photochemically excited state, in particular, Norrish 1 type reaction, which is a cleavage reaction of carbonyl compound at the α-position under a photo-irradiation, or Norrish 2 type reaction, which is an auto-cleavage reaction in which a ketone group having a hydrogen atom to be abstracted at the γ-position of the carbonyl group cleaves to an olefin and a lower molecular weight ketone compound under photo-irradiation.

A typical organic carbonyl compound usable as a photosensitive hydrogen abstracting agent of the present invention includes various organic carbonyl compounds, for example, as follows:

substituted or unsubstituted benzophenones such as benzophenone, methyl o-benzoylbenzoate, 4-phenylbenzophenone, 4-chlorobenzophenone, 4-hydroxybenzophenone, 4-benzoyl-4'-methyldiphenylsulfide, 3,3'-dimethyl-4-methoxybenzophenone, 4,4'-dichlorobenzophenone and 4-methylbenzophenone;

substituted or unsubstituted acetophenones such as acetophenone, 4'-methylacetophenone, 2',4'- or 3',5'-dimethylacetophenone, 4'-methoxyacetophenone, 2-chloro-2-phenylacetophenone, 3',4'-dichloroacetophenone and 4'-hydroxyacetophenone.

substituted or unsubstituted aryl ketones such as benzoin, benzoin methylether, benzoin ethylether, benzoin isopropylether and benzoin isobutylether.

various o, p-quinone compounds such as 1,4-benzoquinone, 2,6-dimethyl-1,4-benzoquinone, 2,6-dichloro-1,4-benzoquinone, anthraquinone, 2-chloroanthraquinone, 2-ethylanthraquinone and 1,4-naphthoquinone.

substituted or unsubstituted thioxanthones such as thioxanthone, 2-chlorothioxanthone, 2-methylthioxanthone, 2-isopropylthioxanthone and 2,4-dichlorothioxanthone.

In the present invention, a photosensitive hydrogen abstracting agent can be adhered or impregnated on a surface of hardened resin in a printing plate by spraying an aqueous developing liquid containing the above-described photosensitive hydrogen abstracting agent in a developing process, which can cause a hydrogen abstraction reaction by a subsequent irradiation of an active light to the printing plate in air to sufficiently reduce tackiness on a surface of the printing plate.

In order to achieve a sufficient impregnation of the photosensitive hydrogen abstracting agent into a printing plate in a developing process, the photosensitive hydrogen abstracting agent is most preferably dissolved in an aqueous developing liquid, but a sufficient effect can be exhibited even it is uniformly dispersed as a suspension state. The term "uniformly dispersed state" means a state in which a necessary amount of the photosensitive hydrogen abstracting agent is dissolved or suspended without precipitation. In a state in which the photosensitive hydrogen abstracting agent is not uniformly dispersed, a sufficient tack removal effect may not be obtained after the developing process due to, for example, precipitation or staying of the photosensitive hydrogen abstracting agent not subjecting to adherence or impregnation into a surface layer of the hardened part of resin in a liquid tank (FIG. 1, 210) of the developing equipment. Alternatively, the photosensitive hydrogen abstracting agent crystallizing in a spray nozzle part (FIG. 1, 112) may cause clogging, which can result in lowering of spray pressure and further malfunction of the equipment.

A mixing method to uniformly disperse the photosensitive hydrogen abstracting agent in a developing liquid includes the following methods. When the photosensitive hydrogen abstracting agent dissolves or uniformly disperses in a developing liquid, the photosensitive hydrogen abstracting agent is charged directly into a developing liquid and mixed. Alternatively, the photosensitive hydrogen abstracting agent may be mixed in a part of a developing liquid in advance, and then the mixture may be charged into a developing liquid. Many photosensitive hydrogen abstracting agents are solid at 10 to 20° C., or do not dissolve or disperse uniformly in an aqueous developing liquid even if liquid. When a developing liquid is heated up at the temperature not lower than 40° C. in the present invention, the photosensitive hydrogen abstracting agent may disperse uniformly even with direct charging. However, when a photosensitive hydrogen abstracting agent is hard to disperse uniformly, it is possible to improve solubility or uniform dispersion of the photosensitive hydrogen abstracting agent by adding a dispersion aid.

A developing liquid of the present invention is preferably sprayed on a printing plate under a high pressure of not lower than 1 MPa and not higher than 30 MPa, in order to sufficiently exhibit its developing effect for unhardened resin by physical impact when sprayed to a printing plate. A pressure lower than 1 MPa can not exhibit a sufficient developing effect to remove unhardened resin by a physical impact, and contrary, a pressure over 30 MPa may damage a relief shape on a surface of the printing plate by the impact of sprayed developing liquid. In particular, an isolated line with a width of not larger than 500 μm and a highlight screen dot with a area density of not higher than 5% may be remarkably damaged by being chipped off or delaminated from a printing plate.

In addition, the temperature of an aqueous developing liquid used in the present invention needs to be not lower than 40° C. By keeping an aqueous developing liquid at a temperature not lower than 40° C., a printing plate having the same plate quality as that of a conventional developing method using a surfactant can be prepared. A reason for this fact arises from the removal effect for unhardened resin by a physical impact in a developing process that is supposed to be drastically improved due to a lowered viscosity of the unhardened resin remained unreacted in an exposure process, which is heated up by contacting with a high temperature developing liquid. In addition, in a post-exposure process using the photosensitive hydrogen abstracting agent, solubility and uniform dispersibility of the photosensitive hydrogen abstracting agent in a developing liquid are generally improved with the temperature of the developing liquid, and a further tack removal effect for a surface of the printing plate increases due to an increased amount of impregnated photosensitive hydrogen abstracting agent because of a more swollen surface of the hardened part of resin. In order to obtain a stable tack removal effect for a plate surface, the temperature of developing liquid is maintained preferably at 40 to 80° C., more preferably at 55 to 65° C.

A developing time in the present invention may be a time to sufficiently wash off unhardened resin. For example, the developing time is 8 to 18 minutes for a photosensitive resin plate with a thickness of 5 to 7 mm. When an aqueous developing liquid contains a photosensitive hydrogen abstracting agent, the amount of the impregnated photosensitive hydrogen abstracting agent can be controlled by adjusting other impregnation conditions such as temperature of the developing liquid, content of the photosensitive hydrogen abstracting agent in the developing liquid, collision force of a high pressure spray developing liquid, and the like to obtain a necessary amount of the impregnated photosensitive hydrogen abstracting agent within a prescribed developing time, since the developing time corresponds to an impregnation time of the photosensitive hydrogen abstracting agent into a hardened part of the resin.

That is, an amount of impregnated photosensitive hydrogen abstracting agent in a surface layer of hardened resin part increases with increasing collision force of a high pressure spray of developing liquid on a surface of the hardened part of the resin. Measures to increase the collision force of the high pressure spray developing liquid on the surface of the hardened part of resin include (1) increasing a hydraulic pressure, (2) increasing the flow rate of the nozzle spray, and (3) shortening the distance between nozzle tip and a surface of printing plate.

With regard to a content of a photosensitive hydrogen abstracting agent in a developing liquid, the content to obtain a sufficient tack removal effect is 0.01 to 10 parts by weight, preferably 0.05 to 10 parts by weight of photosensitive hydrogen abstracting agent for 100 parts by weight of developing liquid. A content lower than 0.01 parts by weight can not give a sufficient tack removal effect for a surface. In contrast, a content over 10 parts by weight can not further increase the tack removal effect for a surface.

Hereinbelow, the developing equipment and the process of the present invention will be described in more detail.

A typical developing equipment to carry out the above-described developing process is composed of a nozzle header having one or more nozzles to spray developing liquid under a pressure of not lower than 1 MPa and not higher than 30 MPa, and a pump capable of delivering developing liquid under the pressure of not lower than 1 MPa and not higher than 30 MPa. In a developing process, the direction of spraying or ejection is not specially limited so long as unhardened resin can be removed. Generally, the direction is almost perpendicular (around 0 to 15 degree) to a surface of the hardened part of the resin, though it may be slightly inclined to the surface of the hardened part of the resin. Spraying of an aqueous developing liquid can be carried out using a single or a plurality of nozzles (for example, a group of nozzles arranged in parallel), and an aqueous developing liquid is sprayed in an atomized state or through a slit-like opening with the nozzles being transferring. In addition, in high pressure spray development, the pressure may be constant or may be developed a plurality of times under different pressures. Further, when development is performed a plurality of times, the kind of developing liquid may be changed, for example, in such a manner as only water for the first time and an aqueous developing liquid containing a photosensitive hydrogen abstracting agent for the second time.

Moreover, a nozzle to spray developing liquid under high pressure may one which sprays by mixing a gas in the developing liquid. An example of such a nozzle which can enhance the collision force, that is, by developing force of a developing liquid by mixing a gas in the developing liquid includes, for example, a nozzle attached to a tip of a gun type delivery section in multi-washing machine Model MUC 100 (made by Shibuya Industry Co., Ltd.).

As a heating device for a developing liquid, a heater for heating up developing liquid is generally equipped in a reservoir tank of the developing liquid. In this case, a heater having a large output is advantageous for controlling the temperature of the developing liquid, because such a heater can heat up the developing liquid up to a target temperature within a short time, and even if the temperature of developing liquid goes down slightly during developing by spraying the developing liquid, the temperature can be returned to the target temperature quickly. In addition, the reservoir tank for the developing liquid preferably has a volume of not less than 4 times of a delivery flow rate of the high pressure pump used. For example, when a pump having a delivery rate of 50 L per minute is used, a volume of reservoir tank for developing liquid is preferably not less than 200 L.

After completion of the above-described high pressure spray development, rinsing is carried out by spraying water on a surface of the printing plate to wash off any aqueous developing liquid remaining on the surface of photosensitive resin letterpress printing plate. A composition of this rinsing water is water only, and hydraulic pressure, spraying direction, time, temperature and type of rinsing are not specially limited so long as the developing liquid remaining on the surface of printing plate can be washed off. In addition, the rinsing water is mixed into the developing liquid as it is, and is subsequently used as a developing liquid. In a developing process of the present invention, the developing liquid is atomized by spraying at high temperature under high pressure, by which procedure water in the developing liquid evaporates, and the developing liquid decreases. However, the volume of the developing liquid can be maintained at a fixed level by adding the above-described rinsing water to the developing liquid. There is no fear that addition of the rinsing water into the developing liquid deteriorates the developing effect due to a decrease of the concentration of surfactant in the developing liquid and quickens a renewal timing of developing liquid, differing from a conventional developing liquid containing surfactant and having a high chemical activity.

After a completion of rinsing step, a water removal process using a gas blow nozzle is usually provided in order to remove rinsing water remaining on the surface of printing plate. Gas pressure, direction of ejection, time, temperature and type of a gas blow are not specially limited so long as rinsing water remaining on the surface of printing plate can be blown off. If rinsing water remains on a surface of the printing plate, an area of a surface of photosensitive resin covered with adhered rinsing water has more oxygen retardation compared with another area not covered with rinsing water in a subsequent post-exposure process. Therefore, the surface of the printing plate covered with rinsing water may whiten or cause a difference in surface tack, compared with an area where an active light is irradiated in air, which makes it difficult to obtain a printing plate with a uniform surface state.

After completion of the water removal step, a post-exposure is carried out in order to enhance the physical properties of the printing plate and remove tackiness from the surface. In the post-exposure process, usually UV light having a wavelength mainly in a range of 200 to 400 nm from light sources such as a metal halide lamp, a low pressure mercury lamp, a chemical lamp or a germicidal lamp is irradiated on the printing plate in air.

An appropriate amount of exposure to obtain a sufficient tack removal effect for a surface varies depending on the kind of photosensitive hydrogen abstracting agent, the content of a photosensitive hydrogen abstracting agent in a resin composition, but requires at least 500 $mJ/cm^2$. Preferably a range of 1,000 to 3,000 $mJ/cm^2$ is usually exposed. An exposure of not less than 5,000 $mJ/cm^2$ is not preferable because it may cause fine cracks on the plate surface.

Tackiness of a surface of printing plate can be evaluated, for example, using a Tack Tester (made by Toyo Seiki Seisaku-Sho, Ltd.). In this measurement, a ring with a diameter of 50 mm made of an aluminum wire with a diameter of 13 mm, which is wound with a polyethylene film at a circumferential surface, is placed on a relief surface of a printing plate with 500 g of load on the aluminum ring for 4 seconds, and then the aluminum ring is pulled up at a rate of 30 mm per minute. An adhesive strength when the aluminum ring is pulled apart from a relief surface is read with a pushable gage. With regard to value by the Tack Tester (hereinafter referred to as tack value), smaller value means a printing plate with less tackiness on the surface. A printing plate with a tack value over 50 g tends to give an inferior print because foreign matter adheres on the surface of the printing plate, and a plate over 100 g tends to stick together when the plates are piled up or cause a picking phenomenon due to adhesion between the plate surface and paper when the printing substrate is paper. A plate with a tack value not larger than 30 g is thought to have no problem caused by tackiness during practical use. In the case of a liquid photosensitive resin printing plate, which is regarded to have particularly large tackiness among printing plates, the tack value generally exceeds 100 g unless special treatment is applied to remove tackiness on a surface.

Hereinbelow, it will be described in more detail by examples and a comparative example that an aqueous developing liquid of the present invention has a developing performance that is not inferior or even more superior compared with a conventional developing liquid with a high chemical activity. The scope and embodiments of the present invention should not be limited by these examples.

REFERENCE EXAMPLE

Conventional Developing Method by a Chemical Developing Liquid

Using a photosensitive resin composition F-320 (made by Asahi Kasei Corp., hereinafter referred to as photosensitive resin A) and a plate-making equipment Model ALF-II (made by Asahi Kasei Corp.), a 7 mm thick plate completed up to the exposure process step was prepared. Exposure amounts were set at an optimum exposure conditions to give: relief depth: 2 mm, shelf layer: 5 mm, back layer: 1 mm, and a highlight dot of 45 LPI/5% could be formed.

To 100 L of water in a liquid tank of a developing equipment Model ALF-400W (rotary drum spray type, made by Asahi Kasei Corp.), 1.5% of APR (TM) wash out agent which can emulsify a liquid photosensitive resin A, 0.5% of surface treatment agent AX-10 (made by Asahi Kasei Corp., photosensitive hydrogen abstracting agent) and 0.3% of anti-foaming agent SH-4 (silicone mixture, made by Asahi Kasei Corp.) were dissolved to obtain a developing liquid.

Using the developing liquid maintained preheated to 30° C., a 7 mm thick printing plate composed of a liquid photosensitive resin A completed up to the exposure process was developed under the conditions of 0.2 MPa delivery hydraulic pressure and 10 minutes developing time. Under these developing conditions, the developing time per unit area becomes 1,640 $sec/m^2$. Then the developed plate was rinsed with tap water until foaming by the developing liquid could not be observed, followed by post-exposure in air with exposure amounts of 1,000 $mJ/cm^2$ by chemical lamps and 2,000 $mJ/cm^2$ by germicidal lamps using a post-exposure unit Model AL-200 UP (made by Asahi Kasei Corp.). Subsequently, the plate was dried for about 30 minutes until water on the plate surface disappeared using a dryer Model ALF-100P (made by Asahi Kasei Corp.), then left for a half day at ordinary temperature to observe the printing plate.

Figure 2A:
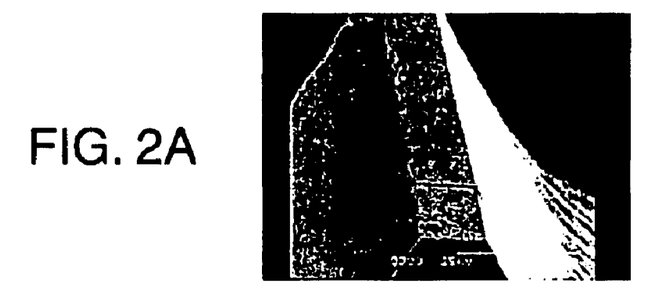
FIGS. 2A to 2D are magnified photographs of measured parts of a photosensitive resin letterpress printing plate obtained by a conventional chemical developing method as a reference example.
Figure 2B:
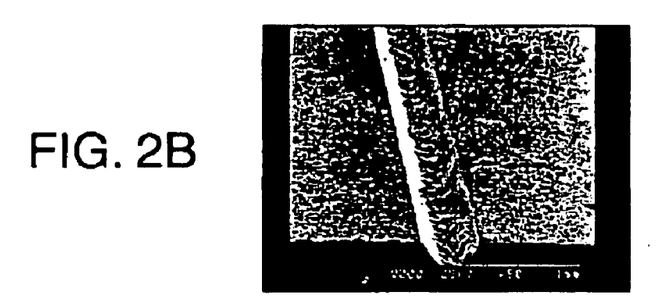
Figure 2C:
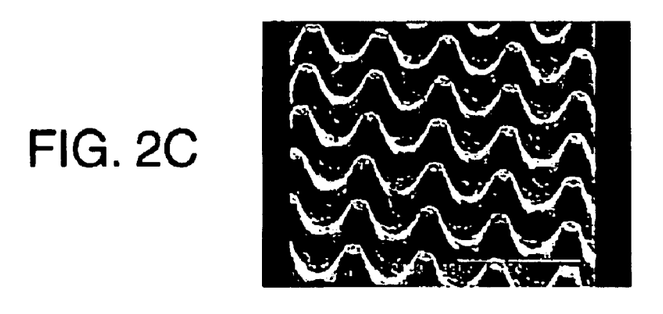
Figure 2D:
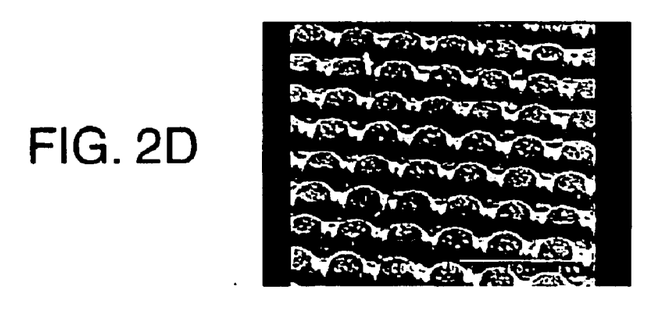

The obtained printing plate of liquid photosensitive resin A was evaluated at its image part by a sensual test to find it to be slightly gentle in touch but not tacky. The appearance of a plate surface was opaque and not shiny. A surface of back layer was visually slightly coarse. The depth of a reverse line with 500 $\mu$m width was measured and found to be about 210 $\mu$m. An area percent of 100 LPI/90% screen dot was measured and found to be about 91%. A width in printing surface of an isolated line with 500 $\mu$m width was measured and found to be 524 $\mu$m (FIG. 2A). Then, line width and depth of a reverse line with 500 $\mu$m width were measured and found to be 492 $\mu$m for line width and 218 $\mu$m for depth, respectively (FIG. 2B). An area percentage of 45 LPI/5% screen dot was 6.1% (FIG. 2C), and the area percentage of 65 LPI/30% screen dot was 32.9% (FIG. 2D), which was a slightly larger value than an image size on negative film. Further, formation state at a base part of 45 LPI/5% screen dot was examined by a microscope, and particularly resin residue was observed, suggesting a slightly insufficient development. Magnified drawings of measured parts of a liquid photosensitive resin A printing plate obtained by the above-described developing method are shown in FIG. 2.

Example 1

Using a photosensitive resin composition F-320 (made by Asahi Kasei Corp., hereinafter referred to as photosensitive resin A) and a plate-making equipment Model ALF-II (made by Asahi Kasei Corp.), a 7 mm thick plate completed up to the exposure process was prepared. Exposure amounts were set at optimum exposure conditions to give: relief depth: 2 mm, shelf height: 5 mm, back layer: 1 mm, and a highlight dot of 45 LPI/5% could be formed.

A developing liquid was prepared by dissolving 0.5% of surface treatment agent AX-10 (made by Asahi Kasei Corp., photosensitive hydrogen abstracting agent) in water. The above-described developing liquid was charged into a liquid tank (volume: 70 L) of a test equipment for high pressure spray development. Using the developing liquid preheated to 60° C., a 7 mm plate composed of a liquid photosensitive resin A completed up to the exposure process was developed with a nozzle header arranged with a plurality of high pressure uniform fan-shaped nozzles VNP-1/8M-6549 (made by Ikeuchi Co., Ltd.) in parallel under the conditions of delivery hydraulic pressure: 8.0 MPa, distance between nozzle and surface of printing plate: 100 mm, nozzle pitch: 100 mm, transfer speed of nozzle header: 6.28 mm/sec, and number of nozzle header passes: 1 time. In these developing conditions, a developing time per unit area becomes 1,590 sec/m$^2$. Then the developed plate was rinsed with tap water until foaming by the developing liquid could not be observed, and further rinsing water remaining on a rinsed plate surface was blown off with a gas gun. Subsequently, post-exposure was carried out in air with an exposure 1,000 mJ/cm$^2$ by chemical lamps and 2,000 mJ/cm$^2$ by germicidal lamps using a post-exposure unit Model AL-200 UP (made by Asahi Kasei Corp.). Then the plate was left for 30 minutes at ordinary temperature to observe the printing plate.

Image surface provided to the printing part (hereinafter referred to as image part) of the obtained printing plate of a liquid photosensitive resin A was evaluated by a sensual test, and found to be not tacky. The appearance of a plate surface looks transparent and slightly shiny. A surface of the back layer was visually in a very smooth state.

Figure 3A:
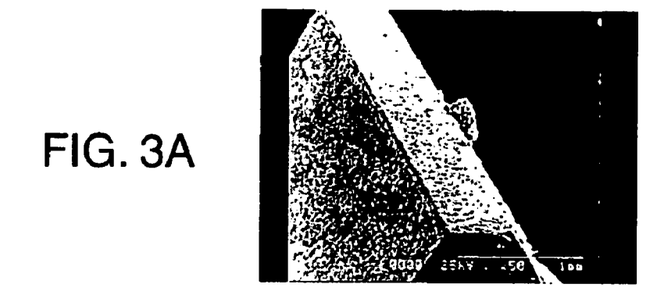
FIGS. 3A to 3D are magnified photographs of measured parts of a photosensitive resin letterpress printing plate obtained in the example 1.
Figure 3B:
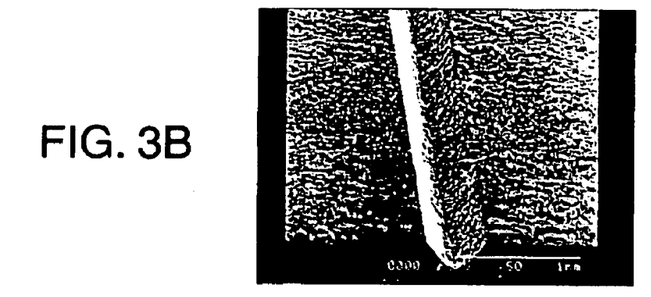
Figure 3C:
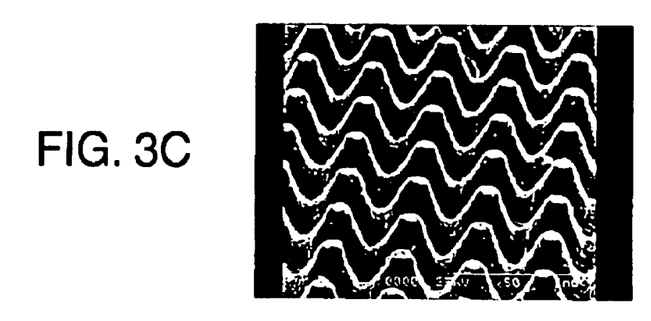
Figure 3D:
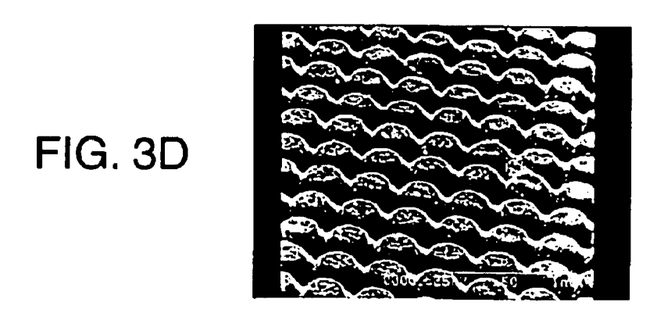

The width in printing surface of an isolated line with 500 μm width was 531 μm (FIG. 3A). Then, line width and depth of a reverse line with 500 μm width were measured and found to be 478 μm for line width and 270 μm for depth, respectively (FIG. 3B). The area percentage of 45 LPI/5% screen dot was 5.1% (FIG. 3C), and the area percentage of 65 LPI/30% screen dot was 33.7% (FIG. 3D), which was a very faithfull value to an image size on negative film. The formation state at a base part of 45 LPI/5% screen dot was examined by a microscope. Neither large damage nor insufficient developing was observed, and a tendency of a significantly large depth among screen dots was confirmed. Magnified drawings of measured parts of a liquid photosensitive resin A printing plate obtained by the above-described developing method are shown in FIG. 3.

Example 2

High Temperature and High Pressure Development by an Aqueous Developing Liquid Mixed with a Gas A liquid photosensitive resin A was prepared under the similar conditions as in example 1.

Using water preheated to 60° C., a 7 mm thick plate composed of a liquid photosensitive resin A completed up to the exposure process was developed using a multi washout equipment Model MUC 1000C (made by Shibuya Industry Co., Ltd.) having one gun-type nozzle with a mechanism to mix a gas into high pressure water under the conditions of delivery hydraulic pressure: 10 MPa, delivery flow rate: 10 L/min, delivery gas pressure: 0.3 MPa, delivery gas flow rate: 1.6 m$^3$/min, distance between nozzle and surface of printing plate: 150 mm, transfer speed in X direction on XY-transfer table: 320 mm/sec, transfer pitch in Y direction: 5 mm, and number of nozzle header passes: 1 time. In these developing conditions, a developing time per unit area becomes 625 sec/m$^2$. Then the developed plate was rinsed with tap water, and further rinsing water remaining on a rinsed plate surface was blown off with a gas gun. Subsequent post-exposure was carried out in air with exposure amounts of 1,000 mJ/cm$^2$ by chemical lamps and 2,000 mj/cm$^2$ by germicidal lamps using a post-exposure unit Model AL-200 UP (made by Asahi Kasei Corp.). Then the plate was left for 30 minutes at ordinary temperature to observe the printing plate.

The appearance of a liquid photosensitive resin A printing plate obtained was evaluated, and neither large damage nor residue of unhardened resin was observed. The depth of a reverse line with 500 μm width was about 230 μm. The area percentage of 100 LPI/90% screen dot was about 90%. The formation state at a base part of 45 LPI/5% screen dot was examined by a microscope. Neither large damage nor insufficient developing was observed.

Example 3

High Temperature and High Pressure Development by an Aqueous Developing Liquid (2)

A liquid photosensitive resin A was prepared under similar conditions as in example 1.

Water was used as a developing liquid, and the above-described developing liquid was charged into a liquid tank (volume: 70 L) of a test equipment for high pressure spray development. Using the developing liquid preheated to 40° C., a 7 mm plate composed of a liquid photosensitive resin A completed up to the exposure process was developed with a nozzle header arranged with a plurality of high pressure uniform fan-shaped nozzles VNP-1/8M-6549 (made by Ikeuchi Co., Ltd.) in parallel under the conditions of delivery hydraulic pressure: 8.0 MPa, distance between nozzle and surface of printing plate: 100 mm, nozzle pitch: 100 mm, transfer speed of nozzle header: 6.28 mm/sec, and number of nozzle header passes: 1 time. Under these developing conditions, a developing time per unit area becomes 1,590 sec/m$^2$. Then the developed plate was rinsed with tap water until foaming by the developing liquid could not be observed. Subsequently, post-exposure was carried out under water with exposure amounts of 1,000 mJ/cm$^2$ by chemical lamps and 2,000 mJ/cm$^2$ by germicidal lamps using a post-exposure unit Model AL-200 UP (made by Asahi Kasei Corp.). Then the plate was left for 30 minutes at ordinary temperature to observe the printing plate.

Figure 4A:
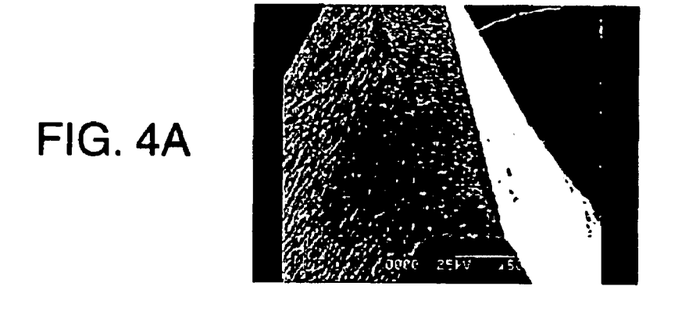
FIGS. 4A to 4D are magnified photographs of measured parts of a photosensitive resin letterpress printing plate obtained in the example 3.
Figure 4B:
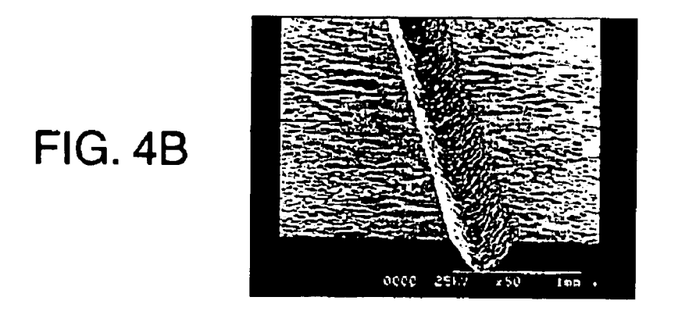
Figure 4C:
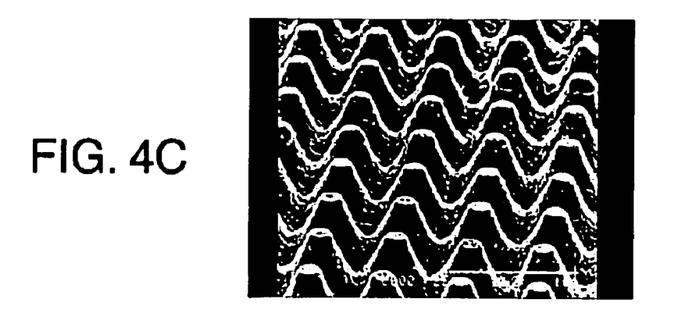
Figure 4D:
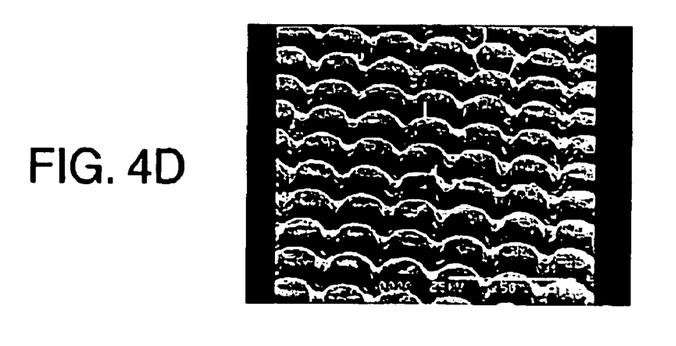

The obtained liquid photosensitive resin A printing plate was evaluated. The appearance of a plate surface looked transparent and slightly shiny. Width in printing surface of an isolated line with 500 μm width was 537 μm (FIG. 4A). Then, line width and depth of a reverse line with 500 μm width were measured and found to be 478 μm for line width and 240 μm for depth, respectively (FIG. 4B). The area percentage of 45 LPI/5% screen dot was 7.4% (FIG. 4C), and the area percentage of 65 LPI/30% screen dot was 37.0% (FIG. 4D). The formation state at a base part of 45 LPI/5% screen dot was examined by a microscope. Neither large damage nor insufficient developing was observed. Magnified drawings of measured parts of a liquid photosensitive resin A printing plate obtained by the above-described developing method are shown in FIG. 4.

Example 4

High Temperature and High Pressure Development by an Aqueous Developing Liquid (3)

A liquid photosensitive resin A was prepared under similar conditions as in example 1.

Water was used as a developing liquid, and the above-described developing liquid was charged into a liquid tank (volume: 70 L) of a test equipment for high pressure spray development. Using the developing liquid preheated to 60° C., a 7 mm plate composed of a liquid photosensitive resin A completed up to the exposure process was developed with a nozzle header arranged with a plurality of high pressure uniform fan-shaped nozzles VNP-1/8M-6549 (made by Ikeuchi Co., Ltd.) in parallel under the conditions of delivery hydraulic pressure: 8.0 MPa, distance between nozzle and surface of printing plate: 100 mm, nozzle pitch: 100 mm, transfer speed of nozzle header: 6.28 mm/sec, and number of nozzle header passes: 1 time. Under these developing conditions, a developing time per unit area becomes 1,590 sec/M$^2$. Then the developed plate was rinsed with tap water until foaming by the developing liquid could not be observed. Subsequently, post-exposure was carried out under water with an exposure of 1,000 mJ/cm$^2$ by chemical lamps and 2,000 mJ/cm$^2$ by germicidal lamps using a post-exposure unit Model AL-200 UP (made by Asahi Kasei Corp.). Then the plate was left for 30 minutes at ordinary temperature to observe the printing plate.

The obtained liquid photosensitive resin A printing plate was evaluated. The appearance of a plate surface looked transparent and slightly shiny. Width in printing surface of an isolated line with 500 μm width was 535 μm. Then, line width and depth of a reverse line with 500 μm width were measured and found to be 458 μm for line width and 270 μm for depth, respectively. An area percentage of 45 LPI/5% screen dot was 5.4%, and the area percentage of 65 LPI/30% screen dot was 30.3%. The formation state at a base part of 45 LPI/5% screen dot was examined by a microscope. Neither large damage nor insufficient developing was observed.

Comparative Example 1

Low Temperature and High Pressure Development by an Aqueous Developing Liquid

A liquid photosensitive resin A was prepared under similar conditions as in example 1.

Water was used as a developing liquid, and the above-described developing liquid was charged into a liquid tank (volume: 70 L) of a test equipment for high pressure spray development. Using the developing liquid maintained at 20° C. in advance, a 7 mm plate composed of a liquid photosensitive resin A completed up to the exposure process was developed with a nozzle header arranged with a plurality of high pressure uniform fan-shaped nozzles VNP-1/8M-6549 (made by Ikeuchi Co., Ltd.) in parallel under the conditions of delivery hydraulic pressure: 8.0 MPa, distance between nozzle and surface of printing plate: 100 mm, nozzle pitch: 100 mm, transfer speed of nozzle header: 6.28 mm/sec, and number of nozzle header passes: 1 time. In these developing conditions, a developing time per unit area becomes 1,590 sec/m$^2$. Then the developed plate was rinsed with tap water until foaming by the developing liquid could not be observed. Subsequently, post-exposure was carried out in air with exposure of 1,000 mJ/cm$^2$ by chemical lamps and 2,000 mJ/cm$^2$ by germicidal lamps using a post-exposure unit Model AL-200 UP (made by Asahi Kasei Corp.). Then the plate was left for 30 minutes at ordinary temperature to observe the printing plate.

Figure 5A:
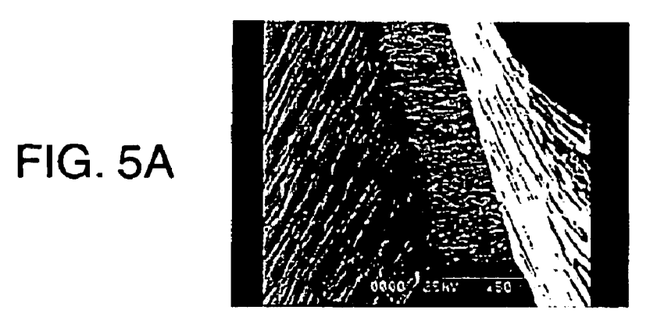
FIGS. 5A to 5D are magnified photographs of measured parts of a photosensitive resin letterpress printing plate obtained in the comparative example 1.
Figure 5B:
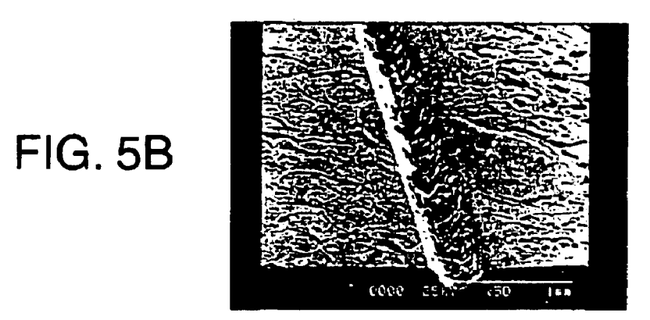
Figure 5C:
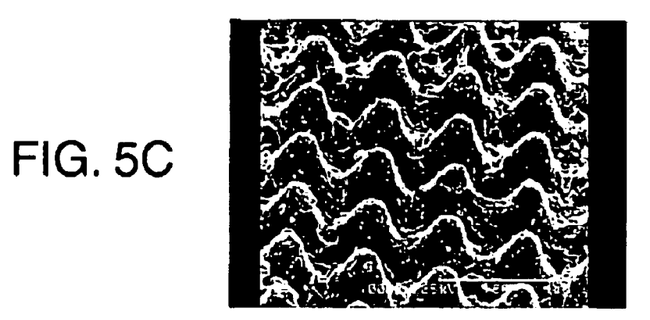
Figure 5D:
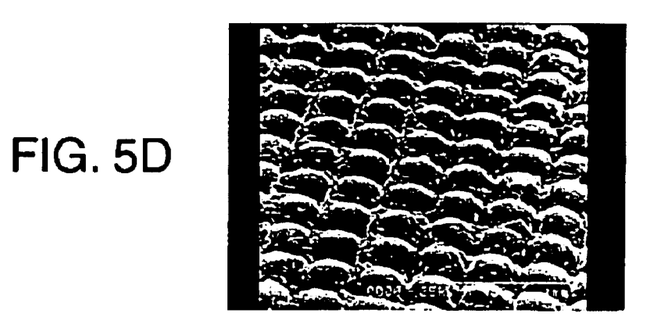

The obtained liquid photosensitive resin A printing plate was evaluated. The appearance of a plate surface looked transparent but considerably shiny because a significant amount of residue of unhardened resin was present. Width in printing surface of an isolated line with 500 μm width was 527 μm (FIG. 5A). A shoulder part of this isolated line with 500 μm width was examined by a microscope, and considerable unevenness was found, suggesting remaining of unhardened resin. Then, line width and depth of a reverse line with 500 μm width were measured and found to be 449 μm for line width and 170 μm for depth (FIG. 5B), respectively. Similarly to the above-described isolated line with 500 μm width, a reverse line with 500 μm width also showed a considerable amount of unhardened resin remained in the reverse line during microscopic examination. An area percentage of 45 LPI/5% screen dot could not be measured because of insufficient developing (FIG. 5C). An area percentage of 65 LPI/30% screen dot also could not be measured because of insufficient developing (FIG. 5D). Formation state at a base part of 45 LPI/5% screen dot was examined by a microscope, and a considerable amount of unhardened resin was found to remain, showing developing was insufficient. Magnified drawings of measured parts of a liquid photosensitive resin A printing plate obtained by the above-described developing method are shown in FIG. 5.

INDUSTRIAL APPLICABILITY

Since a method for developing a photosensitive resin printing plate of the present invention is performed by a high pressure spray development using a physical action, it enables developing a printing plate using an aqueous developing liquid which does not dissolve a photosensitive resin. By using this method, it becomes easy to reuse the worn-out developing liquid after separating and removing photosensitive resin. Thus, this method reduces the amount of waste developing liquid, is advantageous for environmental conservation, and realizes a drastic reduction of a cost for waste liquid treatment.

What is claimed is:

1. A method for developing a photosensitive resin letterpress printing plate comprising: spraying an aqueous developing liquid at a temperature of not lower than 40° C. under a pressure not lower than 1 MPa and not higher than 30 MPa to a photosensitive resin letterpress printing plate after exposure.

2. The method according to claim 1, wherein a gas is mixed in the aqueous developing liquid.

3. The method according to claim 1, wherein said aqueous developing liquid is recycled and reused by removing a mixed-in photosensitive resin from the aqueous developing liquid by means of a filter.

4. The method according to claim 3, wherein a surface of said photosensitive resin letterpress printing plate is sprayed with said aqueous developing liquid, then rinsed with water, and said water is mixed into the aqueous developing liquid.

5. The method according to claim 1, wherein an aqueous developing liquid contains a photosensitive hydrogen abstracting agent.

6. The method according to claim 5, wherein a surface of said letterpress printing plate is sprayed with said aqueous developing liquid, then irradiated with an active light in air.

7. The method according to claim 6, wherein the active light is UV light having a wavelength in a range of 200 to 400 nm.

8. The method according to claim 1, wherein at least one nozzle is used to spray the aqueous developing liquid under the pressure of not lower than 1 MPa and not higher than 30 MPa.

9. The method according to claim 1, wherein a pump capable of delivering the aqueous developing liquid under a pressure of not lower than 1 MPa and not higher than 30 MPa is used.

10. The method according to claim 1, wherein oil-absorbing mat filter, non-woven fabric filter or paper filter is provided on a surface of the aqueous developing liquid reserved in a tank and/or in a pipe through which the aqueous developing liquid flows, and the aqueous developing liquid is filtered with any of said filters.

11. The method according to claim 1, wherein the temperature of the developing liquid is 40–80° C.

12. The method according to claim 1, wherein the photosensitive resin letterpress printing plate is obtained from a liquid photosensitive resin.

* * * * *